(12) United States Patent
Forrest et al.

(10) Patent No.: US 9,768,402 B2
(45) Date of Patent: Sep. 19, 2017

(54) ENHANCED BULK HETEROJUNCTION DEVICES PREPARED BY THERMAL AND SOLVENT VAPOR ANNEALING PROCESSES

(75) Inventors: Stephen R. Forrest, Ann Arbor, MI (US); Mark E. Thompson, Anaheim, CA (US); Guodan Wei, San Jose, CA (US); Siyi Wang, Los Angeles, CA (US)

(73) Assignees: University of Southern California, Los Angeles, CA (US); The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 13/080,759

(22) Filed: Apr. 6, 2011

(65) Prior Publication Data

US 2013/0210189 A1    Aug. 15, 2013

Related U.S. Application Data

(60) Provisional application No. 61/322,039, filed on Apr. 8, 2010, provisional application No. 61/393,646, filed on Oct. 15, 2010.

(51) Int. Cl.
*H01L 51/52* (2006.01)
*H01L 51/00* (2006.01)
*H01L 51/42* (2006.01)

(52) U.S. Cl.
CPC ...... *H01L 51/4253* (2013.01); *H01L 51/0028* (2013.01); *H01L 51/4273* (2013.01); *Y02E 10/549* (2013.01)

(58) Field of Classification Search
CPC ............. H01L 51/0028; H01L 51/4253; H01L 51/4273; Y02E 10/549
See application file for complete search history.

(56) References Cited

U.S. PATENT DOCUMENTS

| | | | |
|---|---|---|---|
| 6,312,971 B1 * | 11/2001 | Amundson et al. | ............ 438/99 |
| 7,194,173 B2 * | 3/2007 | Shtein | ................. H01L 51/4206 385/123 |
| 7,306,968 B2 * | 12/2007 | Brabec et al. | .................. 438/99 |
| 7,722,927 B2 * | 5/2010 | Shtein et al. | .............. 427/255.6 |

(Continued)

FOREIGN PATENT DOCUMENTS

| | | |
|---|---|---|
| CN | 101515631 A | 8/2009 |
| WO | WO 2004/025746 A2 | 3/2004 |
| WO | WO 2010/031042 A1 | 3/2010 |

OTHER PUBLICATIONS

Carsten Deibel and Vladimir Dyakonov, Polymer-Fullerent Bulk Heterojunction Solar Cells, Reports on Progress in Physics, 73, 2010, 096401.*

(Continued)

*Primary Examiner* — Cheung Lee
*Assistant Examiner* — Stephen C Smith
(74) *Attorney, Agent, or Firm* — Finnegan, Henderson, Farabow, Garrett & Dunner LLP

(57) ABSTRACT

A method of preparing a bulk heterojunction organic photovoltaic cell through combinations of thermal and solvent vapor annealing are described. Bulk heterojunction films may prepared by known methods such as spin coating, and then exposed to one or more vaporized solvents and thermally annealed in an effort to enhance the crystalline nature of the photoactive materials.

28 Claims, 19 Drawing Sheets

(56) References Cited

U.S. PATENT DOCUMENTS

| | | | |
|---|---|---|---|
| 7,829,143 B1* | 11/2010 | Bollman | B05D 3/0453 427/248.1 |
| 8,198,117 B2* | 6/2012 | Leidholm et al. | 438/57 |
| 8,431,434 B2* | 4/2013 | Tessler et al. | 438/99 |
| 8,436,134 B2* | 5/2013 | Yu et al. | 528/377 |
| 8,440,496 B2* | 5/2013 | Irvin et al. | 438/82 |
| 2007/0290195 A1* | 12/2007 | Forrest | 257/40 |

OTHER PUBLICATIONS

Conboy et al., "Impact of Solvent Vapor Annealing on the Morphology and Photophysics of Molecular Semiconductor Thin Films," Journal of Physical Chemistry, vol. 102, No. 23, (1998), pp. 4516-4525.

International Search Report and Written Opinion, issued Jul. 14, 2011, in PCT/US2011/031439.

Li et al., "Solvent Annealing Effect in Polymer Solar Cells Based on Poly (3-Hexylthiophene) and Methanofullerenes," Advanced Functional Materials, vol. 17, No. 10, (2007) pp. 1636-1644.

Placencia et al., "Organic Photovoltaic Cells Based on Solvent-Annealed, Textured Titanyl Phthalocyanine/C60 Heterojunctions," Advanced Functional Materials, vol. 19, No. 12, (2009) pp. 1913-1921.

Silvestri et al., "Efficient Squaraine-Based Solution Processable Bulk-Heterojunction Solar Cells," Journal of the American Chemical Society, American Chemical Society, vol. 130, No. 52, (2008) pp. 17640-17641.

"Efficient Solution-Processed Photovoltaic Cells Based on an Anthradithiophene/Fullerene Blend", Matthew T. Lloyd et al., J. Am. Chem. Soc., vol. 129, No. 29, pp. 9144-9149, Jun. 27, 2017.

"The Role of Mesoscopic PCBM Crystallites in Solvent Vapor Annealed Copolymer Solar Cells," Tricia A. Bull et al., ACS Nano, vol. 3, No. 3, pp. 627-636, Feb. 19, 2009.

"Temperature-Enhanced Solvent Vapor Annealing of a C3 Symmetric Hexa-peri-Hexabenzocoronene", Emanuele Treossi et al., Small, vol. 5, No. 1, pp. 112-119, Jan. 7, 2009.

"Efficient, Ordered Bulk Heterojunction Nanocrystalline Solar Cells by Annealing of Ultrathin Squaraine Thin Films," Guodan Wei et al., Nano Lett., 10(9), pp. 3555-3559, Aug. 3, 2010.

"Solution-Processed Squaraine Bulk Heterojunction Photovoltaic Cells," Guodan Wei et al., ACS Nano, 4(4), pp. 1927-1934, Apr. 1, 2010.

* cited by examiner

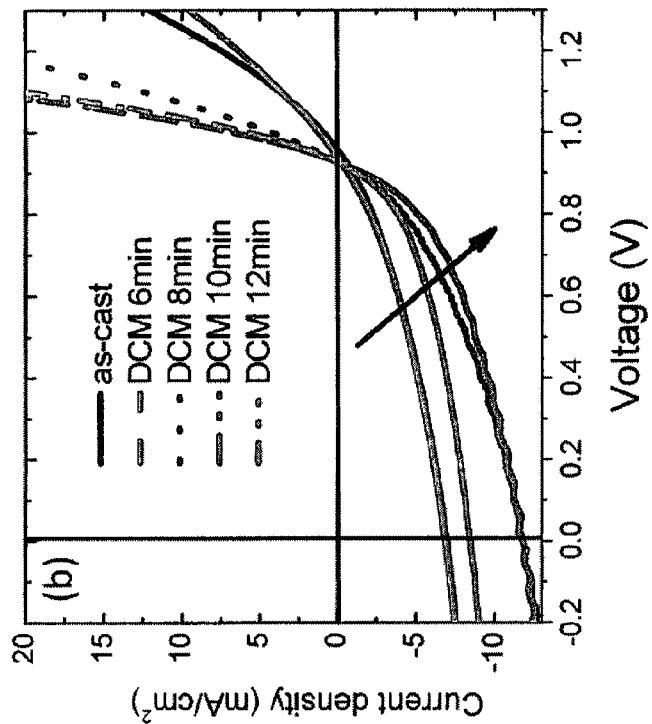
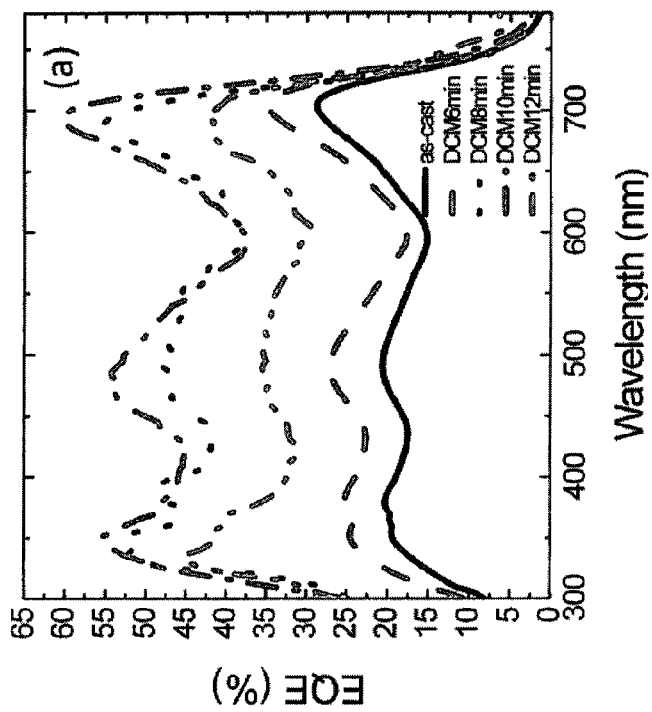
FIG. 3B
FIG. 3A

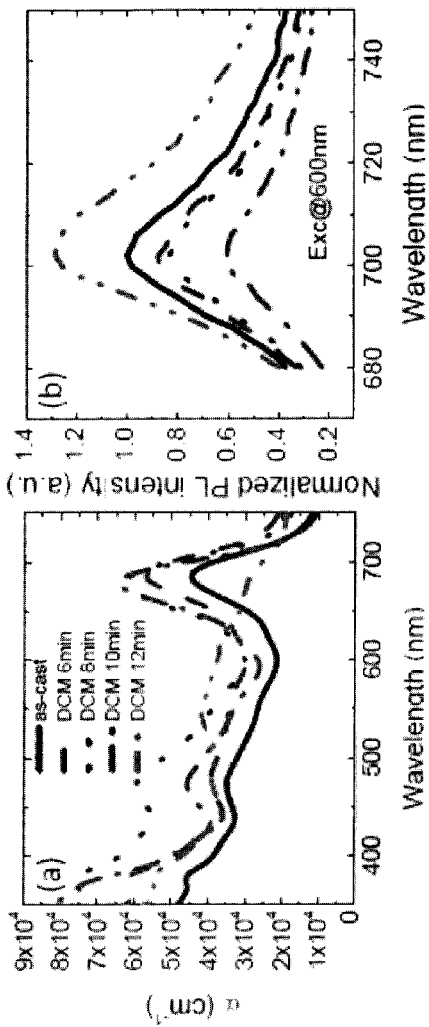
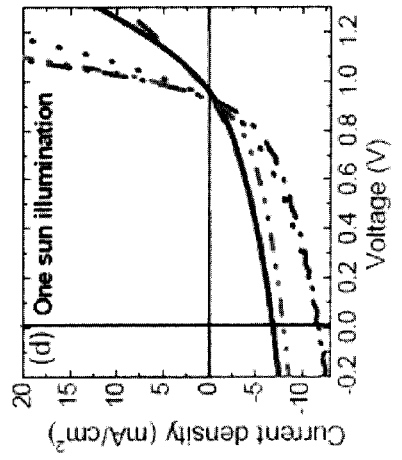
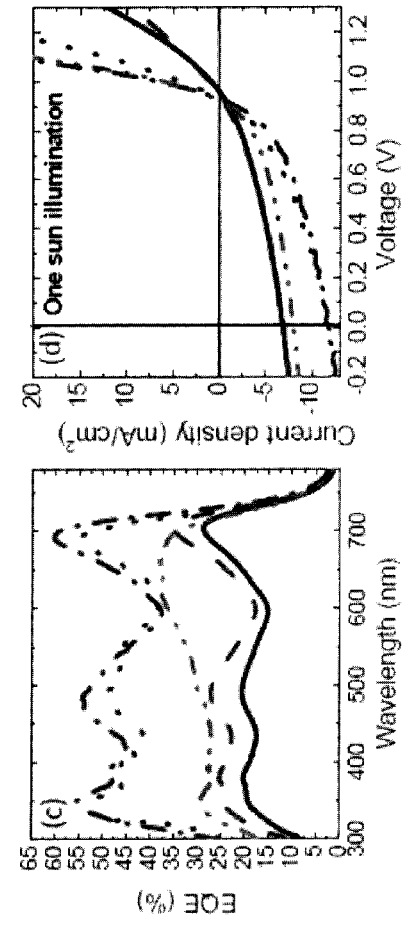
FIG. 6A
FIG. 6B
FIG. 6C
FIG. 6D

ENHANCED BULK HETEROJUNCTION DEVICES PREPARED BY THERMAL AND SOLVENT VAPOR ANNEALING PROCESSES

CROSS-REFERENCE TO RELATED APPLICATIONS

This application claims priority to U.S. Provisional Application Nos. 61/322,039, filed on Apr. 8, 2010, and 61/393,646, filed Oct. 15, 2010, which are both incorporated herein by reference in their entirety.

STATEMENT REGARDING FEDERALLY SPONSORED RESEARCH

The subject matter of this application was prepared with U.S. Government support under Contract No. DE-FG36-08GO18022 awarded by U.S. Department of Energy, National Renewable Energy Laboratory and FA9550-07-1-0364 awarded by the Air Force Office of Scientific Research. The government has certain rights in the subject matter of this application.

JOINT RESEARCH AGREEMENT

The subject matter of this application was made by, on behalf of, and/or in connection with one or more of the following parties to a joint university-corporation research agreement: University of Michigan and Global Photonic Energy Corporation. The agreement was in effect on and before the date the claimed invention was made, and the claimed invention was made as a result of activities undertaken within the scope of the agreement.

FIELD OF THE DISCLOSURE

The present disclosure generally relates to methods of preparing bulk heterojunction organic photovoltaic cells by thermal and solvent vapor annealing processes. More specifically, it is directed to increasing the mesoscopic order and crystallinity of organic thin films by exposing bulk heterojunctions to vaporized solvents, as well as combinations of thermal and solvent vapor annealing.

BACKGROUND

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into electricity. Solar cells, also called photovoltaic (PV) devices, are a type of photosensitive optoelectronic device that is specifically used to generate electrical power. PV devices, which may generate electrical energy from light sources other than sunlight, can be used to drive power consuming loads to provide, for example, lighting, heating, or to power electronic circuitry or devices such as calculators, radios, computers or remote monitoring or communications equipment. These power generation applications also often involve the charging of batteries or other energy storage devices so that operation may continue when direct illumination from the sun or other light sources is not available, or to balance the power output of the PV device with a specific application's requirements. As used herein the term "resistive load" refers to any power consuming or storing circuit, device, equipment or system.

Another type of photosensitive optoelectronic device is a photoconductor cell. In this function, signal detection circuitry monitors the resistance of the device to detect changes due to the absorption of light.

Another type of photosensitive optoelectronic device is a photodetector. In operation, a photodetector is used in conjunction with a current detecting circuit which measures the current generated when the photodetector is exposed to electromagnetic radiation and may have an applied bias voltage. A detecting circuit as described herein is capable of providing a bias voltage to a photodetector and measuring the electronic response of the photodetector to electromagnetic radiation.

These three classes of photosensitive optoelectronic devices may be characterized according to whether a rectifying junction as defined below is present, and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias. As a general rule, a photovoltaic cell provides power to a circuit, device or equipment, but does not provide a signal or current to control detection circuitry, or the output of information from the detection circuitry. In contrast, a photodetector or photoconductor provides a signal or current to control detection circuitry, or the output of information from the detection circuitry but does not provide power to the circuitry, device or equipment.

Traditionally, photosensitive optoelectronic devices have been constructed of a number of inorganic semiconductors, e.g., crystalline, polycrystalline and amorphous silicon, gallium arsenide, cadmium telluride and others. Herein, the term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct, i.e., transport, electric charge in a material. The terms "photoconductor" and "photoconductive material" are used herein to refer to semiconductor materials which are chosen for their property of absorbing electromagnetic radiation to generate electric charge carriers.

PV devices may be characterized by the efficiency with which they can convert incident solar power to useful electric power. Devices utilizing crystalline or amorphous silicon dominate commercial applications, and some have achieved efficiencies of 23% or greater. However, efficient crystalline-based devices, especially of large surface area, are difficult and expensive to produce due to the problems inherent in producing large crystals without significant efficiency-degrading defects. On the other hand, high efficiency amorphous silicon devices still suffer from problems with stability. Present commercially available amorphous silicon cells have stabilized efficiencies between 4 and 8%.

PV devices may be optimized for maximum electrical power generation under standard illumination conditions (i.e., Standard Test Conditions which are 1000 W/m$^2$, AM1.5 spectral illumination), for the maximum product of photocurrent times photovoltage. The power conversion efficiency of such a cell under standard illumination conditions depends on the following three parameters: (1) the current under zero bias, i.e., the short-circuit current $I_{SC}$, in Amperes, (2) the photovoltage under open circuit conditions, i.e., the open circuit voltage $V_{OC}$, in Volts, and (3) the fill factor, ff.

PV devices produce a photo-generated current when they are connected across a load and are irradiated by light. When irradiated under infinite load, a PV device generates its maximum possible voltage, V open-circuit, or $V_{OC}$. When irradiated with its electrical contacts shorted, a PV device generates its maximum possible current, I short-circuit, or $I_{SC}$. When actually used to generate power, a PV device is connected to a finite resistive load and the power output is given by the product of the current and voltage, I×V. The maximum total power generated by a PV device is inherently incapable of exceeding the product, $I_{SC} \times V_{OC}$. When the load value is optimized for maximum power extraction, the current and voltage have the values, $I_{max}$ and $V_{max}$, respectively.

A figure of merit for PV devices is the fill factor, ff, defined as:

$$ff = \{I_{max} V_{max}\} / \{I_{SC} V_{OC}\} \quad (1)$$

where ff is always less than 1, as $I_{SC}$ and $V_{OC}$ are never obtained simultaneously in actual use. Nonetheless, as ff approaches 1, the device has less series or internal resistance and thus delivers a greater percentage of the product of $I_{SC}$ and $V_{OC}$ to the load under optimal conditions. Where $P_{inc}$ is the power incident on a device, the power efficiency of the device, $\eta_P$, may be calculated by:

$$\eta_P = ff^* (I_{SC}^* V_{OC}) / P_{inc}$$

To produce internally generated electric fields that occupy a substantial volume of the semiconductor, the usual method is to juxtapose two layers of material with appropriately selected conductive properties, especially with respect to their distribution of molecular quantum energy states. The interface of these two materials is called a photovoltaic junction. In traditional semiconductor theory, materials for forming PV junctions have been denoted as generally being of either n or p type. Here n-type denotes that the majority carrier type is the electron. This could be viewed as the material having many electrons in relatively free energy states. The p-type denotes that the majority carrier type is the hole. Such material has many holes in relatively free energy states. The type of the background, i.e., not photo-generated, majority carrier concentration depends primarily on unintentional doping by defects or impurities. The type and concentration of impurities determine the value of the Fermi energy, or level, within the gap between the conduction band minimum and valance band maximum energies. The Fermi energy characterizes the statistical occupation of molecular quantum energy states denoted by the value of energy for which the probability of occupation is equal to ½. A Fermi energy near the conduction band minimum energy indicates that electrons are the predominant carrier. A Fermi energy near the valence band maximum energy indicates that holes are the predominant carrier. Accordingly, the Fermi energy is a primary characterizing property of traditional semiconductors and the prototypical PV junction has traditionally been the p-n interface.

The term "rectifying" denotes, inter alia, that an interface has an asymmetric conduction characteristic, i.e., the interface supports electronic charge transport preferably in one direction. Rectification is associated normally with a built-in electric field which occurs at the junction between appropriately selected materials.

Conventional inorganic semiconductor PV cells employ a p-n junction to establish an internal field. Early organic thin film cells, such as reported by Tang, *Appl. Phys Lett.* 48, 183 (1986), contain a heterojunction analogous to that employed in a conventional inorganic PV cell. However, it is now recognized that in addition to the establishment of a p-n type junction, the energy level offset of the heterojunction also plays an important role.

The energy level offset at the organic D-A heterojunction is believed to be important to the operation of organic PV devices due to the fundamental nature of the photo-generation process in organic materials. Upon optical excitation of an organic material, localized Frenkel or charge-transfer excitons are generated. For electrical detection or current generation to occur, the bound excitons must be dissociated into their constituent electrons and holes. Such a process can be induced by the built-in electric field, but the efficiency at the electric fields typically found in organic devices (F ~$10^6$ V/cm) is low. The most efficient exciton dissociation in organic materials occurs at a donor-acceptor (D-A) interface. At such an interface, the donor material with a low ionization potential forms a heterojunction with an acceptor material with a high electron affinity. Depending on the alignment of the energy levels of the donor and acceptor materials, the dissociation of the exciton can become energetically favorable at such an interface, leading to a free electron polaron in the acceptor material and a free hole polaron in the donor material.

Organic PV cells have many potential advantages when compared to traditional silicon-based devices. Organic PV cells are light weight, economical in materials use, and can be deposited on low cost substrates, such as flexible plastic foils. However, organic PV devices typically have relatively low external quantum efficiency (electromagnetic radiation to electricity conversion efficiency), being on the order of 1% or less. This is, in part, thought to be due to the second order nature of the intrinsic photoconductive process. That is, carrier generation requires exciton generation, diffusion and ionization or collection. There is an efficiency η associated with each of these processes. Subscripts may be used as follows: P for power efficiency, EXT for external quantum efficiency, A for photon absorption, ED for diffusion, CC for collection, and INT for internal quantum efficiency. Using this notation:

$$\eta_P \sim \eta_{EXT} = \eta_A^* \eta_{ED}^* \eta_{CC}$$

$$\eta_{EXT} = \eta_A^* \eta_{INT}$$

The diffusion length ($L_D$) of an exciton is typically much less ($L_D$~50Å) than the optical absorption length (~500Å), requiring a trade-off between using a thick, and therefore resistive, cell with multiple or highly folded interfaces, or a thin cell with a low optical absorption efficiency.

Several methods for making bulk heterojunction (BHJ) devices include phase separation during spin-coating of polymers, phase segregation from a donor-acceptor mixture induced by high temperature annealing of small-molecular-weight organic layers, and controlled growth of small-molecular-weight organic layers with Organic Vapor Phase Deposition.

One challenge for efficient bulk heterojunction solar cells is to generate a maximized interface between donor and acceptor materials within the photoactive layer to ensure efficient dissociation of the excitons, while typical dimensions of phase separation are within the exciton diffusion range and continuous pathways for transport of charge carriers to the electrode. To realize an ideal material system and blend structure for efficient solar cells, it may be desirable to manipulate the donor-acceptor blend morphology and crystallinity through one or more annealing processes, such as thermal and solvent vapor annealing.

While the spin-cast process provides a simple and convenient way to prepare homogeneous thin films, the solvent may evaporate quickly during its process and phase separation of intimately mixed donor and acceptor materials may be suppressed. Because organic materials may form amorphous, crystalline, or semi-crystalline structures during casting from solution, different evaporation times for different solvents may affect the dynamic assembly process of the organic molecules. This, in turn, may determine the microstructure and morphology of active layer, and the resulting variability in carrier transport properties and device performance. Thus, thin films obtained from spin coating are typically not in their thermodynamically equilibrium state, such that thermodynamic forces drive the films to reorganize toward the stable equilibrium state. This evolution may be accelerated at elevated temperature or solvent vapor pressure.

In organic semiconductive materials, post-annealing may enhance the charge carrier transport by increasing the mesoscopic order and crystallinity, which can manifest itself in maximizing intermolecular $\pi$-$\pi$ stacking. In general, the performance of bulk solar cells can be optimized by controlling the nanometer morphology of the active layer. For small molecule bulk solar cells, thermal annealing processes have been explored in DPP(TBFu)$_2$/PC$_{70}$BM systems to increase charge-carrier mobility and improve carrier collection.

Alternatively, solvent vapor annealing may be useful for active-layer morphology control and optimizations. Here, the atmosphere saturates with solvent rapidly and allows the film-formation kinetics to be prolonged further. This further film formation, like thermal annealing, may lead to improved interpenetration of the donor/acceptor domains as well as the increased order within donor domains. Accordingly, there remains a need to further develop active-layer morphology control and optimizations. Applicants describe herein solvent vapor annealing processes that not only meets this need, but which can be used to prepare bulk heterojunction devices with enhanced performance characteristics. Applicants also described combinations of thermal and solvent vapor annealing that result in optimized active-layer morphologies and bulk heterojunction devices with enhanced performance characteristics.

SUMMARY

There are disclosed methods of preparing bulk heterojunction organic photosensitive devices comprising exposure to certain thermal and/or solvent vapor annealing processes. In one embodiment, a method of preparing a photosensitive device comprises:

providing a structure comprising at least one electrode and a bulk heterojunction, wherein the bulk heterojunction comprises at least one first photoactive material and at least one second photoactive material;

providing at least one solvent;

vaporizing at least a portion of the solvent; and exposing at least a portion of the structure to the vaporized solvent, wherein the exposure to the vaporized solvent increases the crystallinity of at least one of the first and second photoactive materials.

In some embodiments, the method further comprises thermally annealing the structure. In some embodiments, the thermal annealing step takes place after exposing at least a portion of the structure to the vaporized solvent.

In another embodiment, there is described a method of enhancing the crystallinity of a bulk heterojunction in a photosensitive device, the bulk heterojunction comprising at least one first and at least one second organic photoactive material. In one embodiment, the method comprises:

exposing at least a portion of the bulk heterojunction to a vaporized solvent, wherein the photosensitive device exhibits one or more of the following characteristics when compared to the device without exposure to the vaporized solvent:

increased fill factor (FF);
increased external quantum efficiency (EQE); and
increased current density versus voltage (J-V).

In some embodiments, the method further comprises thermally annealing the structure. In some embodiments, the thermal annealing step takes place after exposing at least a portion of the structure to the vaporized solvent.

BRIEF DESCRIPTION OF THE DRAWINGS

The accompanying drawings, which are incorporated in and constitute a part of this specification, illustrate several embodiments described herein and, together with the description, serve to explain the principles of this application. The figures are not necessarily drawn to scale.

FIG. 3A illustrates EQE for SQ:PC$_{70}$BM (1:6) bulk solar cells cast from 1,2-dichlorobenzene and solvent annealed with dichloromethane for various exposure periods.

FIG. 3B illustrates J-V for bulk heterojunction devices cast from 1,2-dichlorobenzene and solvent annealed with dichloromethane for various exposure periods.

FIG. 6A illustrates the absorption coefficients for SQ:PC$_{70}$BM (1:6) bulk solar cells cast from DCB and solvent annealed with dichloromethane for various exposure periods.

FIG. 6B illustrates the PL (photoluminescence) intensity for SQ:PC$_{70}$BM (1:6) bulk solar cells cast from DCB and solvent annealed with dichloromethane for various exposure periods (see FIG. 6A legend).

FIG. 6C illustrates the EQE for SQ:PC$_{70}$BM (1:6) bulk solar cells cast from DCB and solvent annealed with dichloromethane for various exposure periods (see FIG. 6A legend).

FIG. 6D illustrates the current density versus V (voltage) for SQ:PC$_{70}$BM (1:6) bulk solar cells cast from DCB and solvent annealed with dichloromethane for various exposure periods (see FIG. 6A legend).

DETAILED DESCRIPTION OF THE INVENTION

Definitions

Figure 1A:
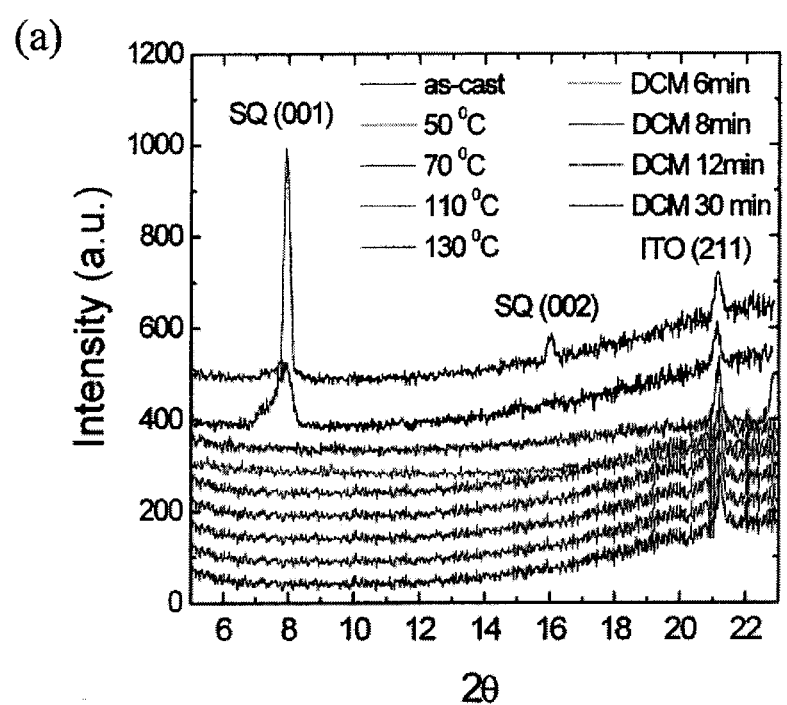
FIG. 1A illustrates the XRD (x-ray diffraction data) for SQ:PC$_{70}$BM (1:6) bulk solar cells cast from chloroform and thermally annealed at various temperatures for a period of 10 minutes, and SQ:PC$_{70}$BM (1:6) bulk solar cells cast from chloroform and solvent annealed with dichloromethane for various exposure periods.

As used herein, the term "organic" includes polymeric materials as well as small molecule organic materials that may be used to fabricate organic optoelectronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule." In general, a small molecule has a defined chemical formula with a molecular weight that is the same from molecule to molecule, whereas a polymer has a defined chemical formula with a molecular weight that may vary from molecule to molecule. As used herein, "organic" includes, but is not limited to, metal complexes of hydrocarbyl and heteroatom-substituted hydrocarbyl ligands.

Methods and processes are described herein for using solvent annealing, and specifically solvent vapor annealing, and thermal annealing during the preparation bulk heterojunction organic photovoltaic cells. The morphology and phase separation of the organic materials may be important in that they enable both charge separation and collection. The solvent vapor annealing process described herein may be useful in having a templating effect on one or more of the organic photoactive materials comprising the bulk heterojunction, which results in the self-assembling of the organic material to form ordered aggregates. Nanomorphology and crystallinity of the organic materials may be dependent on solvent type and duration. In some embodiments, the solvent vapor annealing and/or thermal annealing processes described herein may be capable of increasing the crystalline features of one or more of the organic materials comprising a bulk heterojunction blend that is largely amorphous in nature as cast.

In one embodiment, there is described a method of preparing a photosensitive device which comprises:

providing a structure comprising at least one electrode and a bulk heterojunction, wherein the bulk heterojunction comprises at least one first organic photoactive material and at least one second organic photoactive material;

providing at least one solvent;

vaporizing at least a portion of the solvent; and exposing at least a portion of the structure to the vaporized solvent, wherein the exposure increases the crystallinity of at least one of the first or second organic photoactive materials.

In some embodiments, the method further comprises thermally annealing the structure. In some embodiments, the thermal annealing step takes place after exposing at least a portion of the structure to the vaporized solvent.

In some embodiments, the structure may be prepared by depositing the at least one first and the at least one second organic photoactive materials over the first electrode. After the annealing process is complete, a second electrode may be patterned over the bulk heterojunction.

Electrodes, such as anodes and cathodes, may be composed of metals or "metal substitutes." Herein the term "metal" is used to embrace both materials composed of an elementally pure metal, and also metal alloys which are materials composed of two or more elementally pure metals. The term "metal substitute" refers to a material that is not a metal within the normal definition, but which has the metal-like properties such as conductivity. Metal substitutes include, for example, doped wide-bandgap semiconductors, degenerate semiconductors, conducting oxides, and conductive polymers.

The term "cathode" is used in the following manner. In a non-stacked PV device or a single unit of a stacked PV device under ambient irradiation and connected with a resistive load and with no externally applied voltage, e.g., a PV device, electrons move to the cathode from the photoconducting material. Similarly, the term "anode" is used herein such that in a PV device under illumination, holes move to the anode from the photoconducting material, which is equivalent to electrons moving in the opposite manner. It will be noted that as the terms are used herein, anodes and cathodes may be electrodes or charge transfer layers.

Electrodes may comprise a single layer or multiple layers (a "compound" electrode), and may be transparent, semi-transparent, or opaque. Examples of electrodes and electrode materials include, but are not limited to, those disclosed in U.S. Pat. No. 6,352,777 to Bulovic et al., and U.S. Pat. No. 6,420,031, to Parthasarathy, et al., each incorporated herein by reference for disclosure of these respective features. As used herein, a layer is said to be "transparent" if it transmits at least 50% of the ambient electromagnetic radiation in a relevant wavelength.

In one embodiment, the first electrode may comprise an interfacial layer comprising molybdenum oxide (MoOx). MoOx is an exemplary interfacial layer in organic PV cells, which is believed to serve to reduce dark current and increase open circuit voltage (Li, N. et al., *Open circuit voltage enhancement due to reduced dark current in small molecule photovoltaic cells*, Appl. Phys. Lett., 94, 023307, January 2009).

In some embodiments, the first organic photoactive material may comprise a donor-type material. Non-limiting examples of the first organic photoactive material that may be used herein include subphthalocyanine (SubPc), copper pthalocyanine (CuPc), chloroaluminium phthalocyanine (ClAlPc), tin phthalocyanine (SnPc), pentacene, tetracene, diindenoperylene (DIP), and squaraine (SQ).

In some embodiments, the second organic photoactive material may comprise an acceptor-type material. Non-limiting examples of second organic photoactive materials that may be used herein include $C_{60}$, $C_{70}$, [6,6]-phenyl $C_{70}$ butyric acid methyl ester ($PC_{70}BM$), 3,4,9,10-perylenetetracarboxylicbis-benzimidazole (PTCBI), and hexadecafluorophthalocyanine ($F_{16}CuPc$).

In another embodiment, a blocking layer may be included, such as between the bulk heterojunction and the second electrode. Examples of exciton blocking layers (EBLs) are described in U.S. Pat. Nos. 6,451,415 and 7,230,269 to Forrest et al., which are incorporated herein by reference for their disclosures related to EBLs. Additional background explanation of EBLs may also be found in Peumans et al., "Efficient photon harvesting at high optical intensities in ultrathin organic double-heterostructure photovoltaic diodes," *Applied Physics Letters* 76, 2650-52 (2000), which is also incorporated herein by reference. EBLs are believed to reduce quenching by preventing excitons from migrating out of the donor and/or acceptor materials. Non-limiting examples of the exciton blocking layer that may be used herein include bathocuproine (BCP), bathophenanthroline (BPhen), 3,4,9,10-perylenetetracarboxylicbis-benzimidazole (PTCBI), 1,3,5-tris(N-phenylbenzimidazol-2-yl)benzene (TPBi), tris(acetylacetonato) ruthenium(III) (RuAcaca3), and aluminum(III)phenolate ($Alq_2$ OPH).

Examples of the second electrode that may be used herein include a metal substitute, a non-metallic material or a metallic material chosen from, for example, Ag, Au, and Al.

It is appreciated that the first electrode may comprise a conducting oxide, such as one chosen from indium tin oxide (ITO), tin oxide (TO), gallium indium tin oxide (GITO), zinc oxide (ZO), and zinc indium tin oxide (ZITO), and the transparent conductive polymers comprises polyanaline (PANI). In one embodiment, the bulk heterojunction organic photovoltaic cell comprises:

$ITO/MoO_3/SQ:PC_{70}BM/LiF/Al$; and $ITO/MoO_3/SQ:PC_{70}BM/C_{60}/BCP/LiF/Al$.

The organic layers described herein may have thicknesses ranging from 25-1200 Å, such as 50-950 Å, or even 100-700 Å.

In some embodiments, a bulk heterojunction may be made, for example, by vacuum thermal evaporation (VTE), spin coating, or organic vapor phase deposition (OVPD). OVPD is different from vacuum thermal evaporation (VTE) in that OVPD uses a carrier gas to transport vapors into a deposition chamber. Spatially separating the functions of evaporation and transport leads to precise control over the deposition process, and enabling control over the organic surface morphology, e.g., flat with smooth surface or layers with protrusions.

In one embodiment, the bulk heterojunction is prepared by spin coating. The use of different solvent systems when preparing bulk heterojunctions via spin coating may have an effect on the ultimate efficiency of the photosensitive device upon completion. For example, devices may be made with solvents having a lower boiling point temperature, or those with a higher boiling point. Because low boiling-point solvents evaporate quickly, it may be desirable to use higher boiling-point solvents to further control morphology. In some embodiments, the use of solvents like 1,2-dichlorobenzene (DCB) in the initial preparation of the bulk heterojunction may ultimately result in PV devices exhibiting improved performance properties after solvent vapor annealing when compared to those prepared with lower boiling-point solvents.

In some embodiments, the at least one first and the at least one second organic photoactive materials are cast from a casting solvent having a boiling point no greater than about 70° C. at 1 atm. Exemplary solvents may include chloroform. In another embodiment, the at least one first and the at least one second organic photoactive materials are cast from a casting solvent having a boiling point greater than about 130° C. at 1 atm. In another embodiment, the at least one first and the at least one second organic photoactive materials are cast from a casting solvent having a boiling point greater than about 175° C. at 1 atm. Exemplary solvents may include DCB.

To improve the characteristics of bulk heterojunction PV cells, the film morphology of the deposited organic layers may be further optimized by exposing one or more of the organic photoactive materials to solvent vapor annealing. In some embodiments, one or more solvents may be employed to achieve optimal annealing. Exposure times may also affect the ultimate morphology of the organic materials.

An exemplary vaporizing solvent includes dichloromethane. In some embodiments, it may be desirable to expose the structure to the vaporized solvent in a closed container. In some embodiments, the structure may be exposed to the vaporized solvent for a period of about 5 minutes to about 30 minutes or more, such as from 6 minutes to about 15 minutes, or even about 10 minutes to about 12 minutes.

In some embodiments, it may also be desirable to further expose the heterojunction to thermal annealing. A thermal annealing step may help to further control the morphology, crystallinity, and/or enhanced performance of the prepared devices. For example, it may be desirable to thermally anneal the structure after the as-cast device has been exposed to solvent vapor annealing. Thermal annealing may take place at a temperature that is sufficient to drive off any remaining solvent from the vapor annealing step. For example, after exposing a structure to solvent vapor annealing with dichloromethane, it may be desirable to thermally anneal the device by applying heat directly to the structure. This may be accomplished by placing the structure on a hotplate heated to 50° C. under a $N_2$ atmosphere.

Also described herein are methods of enhancing the crystallinity of a bulk heterojunction in a photosensitive device, wherein the bulk heterojunction comprising at least one first and at least one second organic photoactive materials. In this embodiment, the method comprises:

exposing at least a portion of the bulk heterojunction to a vaporized solvent, wherein the photosensitive device exhibits one or more of the following characteristics when compared to the device without exposure to the vaporized solvent:
  increased fill factor (FF);
  increased external quantum efficiency (EQE); and
  increased current density versus voltage (J-V).

In some embodiments, the method further comprises thermally annealing the structure. In some embodiments, the thermal annealing step takes place after exposing at least a portion of the structure to the vaporized solvent.

Suitable methods and materials include, but are not limited to, those discussed in detail below.

EXAMPLES

The present disclosure may be understood more readily by reference to the following detailed description of exemplary embodiments and the working examples. It is understood that other embodiments will become apparent to those skilled in the art in view of the description and examples disclosed in this specification.

Example 1

X-ray-diffraction (XRD) patterns of the SQ:PC$_{70}$BM (in weight concentrations of 1:6) thin films that were spin-coated on indium tin oxide (ITO) substrates precoated with 80 Å MoO$_3$ at a rate of 6000 RPM (revolutions per minute) were obtained using a Rigaku diffractometer in the θ-2θ geometry using a 40 kV Cu K$_\alpha$ radiation source. The thicknesses of the SQ:PC$_{70}$BM (1:6) blend cast from 20 mg/ml solutions in chloroform, as determined by using Woolam VASE ellipsometer, were 680 Å. Atomic force microscopy (AFM) images were collected in a Nanoscope III AFM in a tapping mode. For solvent annealing samples, SQ:PC$_{70}$BM (1:6) bulk films were post annealed in a closed glass vial filled with 1 ml dichloromethane (DCM) for times varying from 6 min to 30 min. For thermal annealing samples, SQ:PC$_{70}$BM (1:6) films were annealed on a hotplate in $N_2$ glovebox at 50° C., 70° C., 110° C. and 130° C. for 10 min.

Next DCM solvent annealing of as-cast SQ:PC$_{70}$BM(1:6) films (from chloroform solvent) was performed on solar cells having the following structure: ITO/MoO$_3$ (80 Å)/SQ:PC$_{70}$BM(1:6 680 Å)/LiF (8Å)/Al (1000 Å). Devices were then capped with thermally evaporated C$_{60}$ layer have the structure of ITO/MoO$_3$ (80 Å)/SQ:PC$_{70}$BM(1:6 680 Å)/C$_{60}$ (40 Å)/BCP(10 Å)/LiF (8 Å)/Al (1000 Å). MoO$_3$ was then thermally evaporated onto the ITO surface in a vacuum system with a base pressure of $10^{-7}$ torr. The devices were completed by thermally evaporating a 8 Å LiF and 1000 Å thick Al cathode through a shadow mask resulting in a device area of $7.9 \times 10^{-3}$ cm$^2$. The current density-voltage (J-V) characteristics and $\eta_p$ of the devices were measured using an Oriel 150 W solar simulator irradiation from a Xe arc lamp with AM1.5G filters and an NREL calibrated standard Si detector. Measurements and solar spectral correction were made using standard methods. The EQE was measured using monochromated light from a Xe-lamp chopped at 400 Hz and focused to the device active area.

Figures 1B, 1C, 1D:
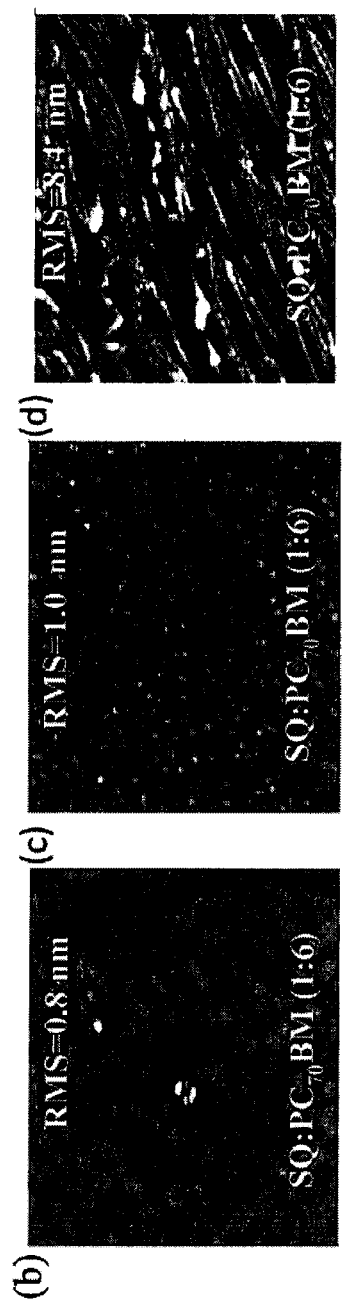
FIG. 1B-1D illustrates the RMS (root-mean-square) roughness for SQ:PC$_{70}$BM (1:6) bulk solar cells as-cast from chloroform, thermally annealed at 70° C. for 10 minutes, and solvent annealed with dichloromethane for 12 minutes, respectively.

As shown in FIG. 1A, there does not appear to be any XRD peaks for SQ:PC$_{70}$BM (1:6) bulk solar cells thermally annealed at 50° C., 70° C., 110° C. and 130° C. for 10 min, indicating amorphous features. In contrast, there appear to be two XRD peaks of SQ which can be well indexed to (001) and (002) peaks after DCM solvent annealing longer than 12 min. Without being bound to any particular theory, because SQ peaks in SQ:PC$_{70}$BM (1:6) mixture after solvent annealing appear relatively weak, it is believed that SQ forms aligned/crystalline domains, between which are amorphous segments of SQ and PC$_{70}$BM. The roughness of AFM images for the as-cast (FIG. 1B) and four thermally annealed samples were averaged to be about 0.58±0.12 nm and there was no obvious phase separation contrast of SQ and PC$_{70}$BM phases, which appeared consistent with the measurement of XRD results. It is believed that the PC$_{70}$BM may disrupt the aggregation of SQ molecules and damages its crystallinity for as-cast SQ:PC$_{70}$BM films (FIG. 1A). In contrast, the roughness of SQ:PC$_{70}$BM films after solvent annealing appeared to increase with one order of magnitude from about 0.58±0.12 nm (as-cast) to about 5.6±1.2 nm (DCM for 8 min—FIG. 1C). The longer DCM annealing time of 12 min appeared to double the roughness of the SQ:PC$_{70}$BM (1:6) blends (FIG. 1D), suggesting stronger phase separation occurred when more SQ clusters started to grow into polycrystals. Thus, it is believed that DCM annealing of amorphous as-cast SQ:PC$_{70}$BM (1:6) films provided a nanocrystalline morphology of the SQ phase.

Figures 2A, 2B:
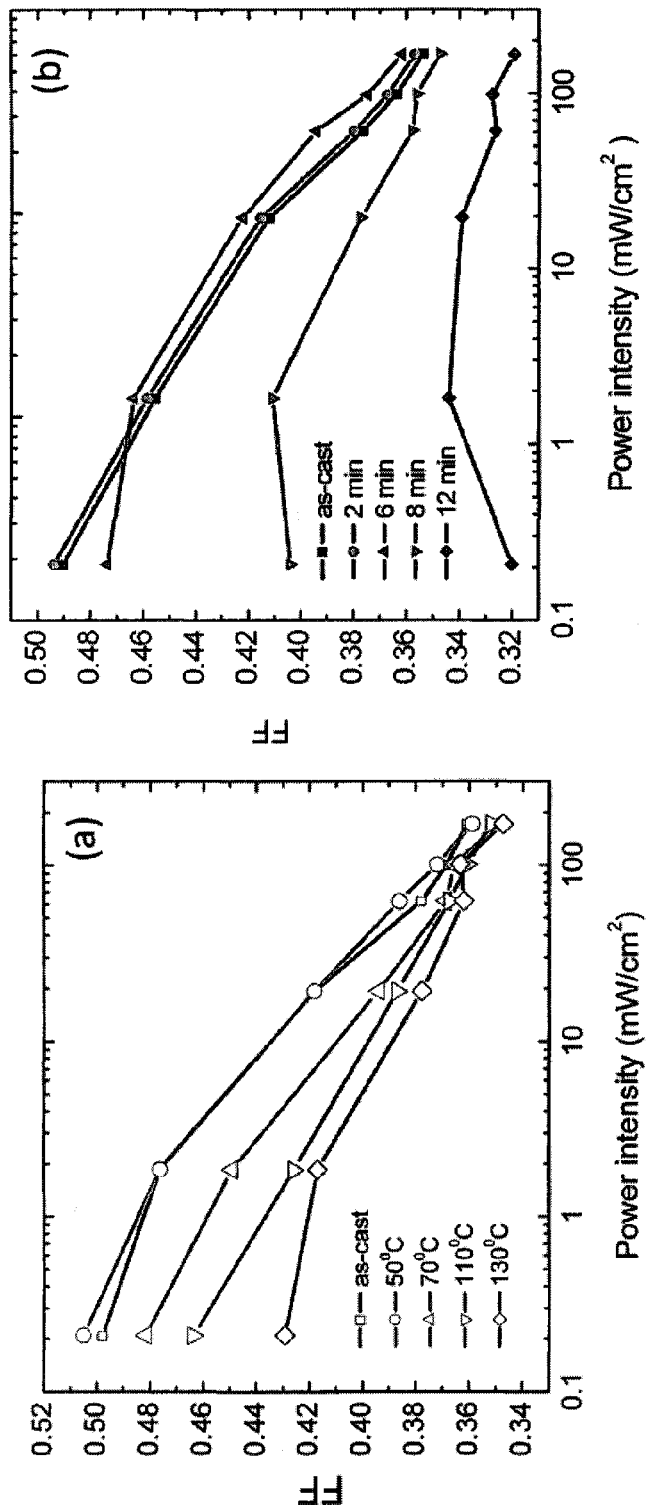
FIG. 2A illustrates FF versus power intensity for SQ:PC$_{70}$BM (1:6) bulk solar cells cast from chloroform and thermally annealed at various temperatures.
FIG. 2B illustrates FF versus power intensity for SQ:PC$_{70}$BM (1:6) bulk solar cells cast from chloroform and solvent annealed with dichloromethane for various exposure periods.
Figure 2C:
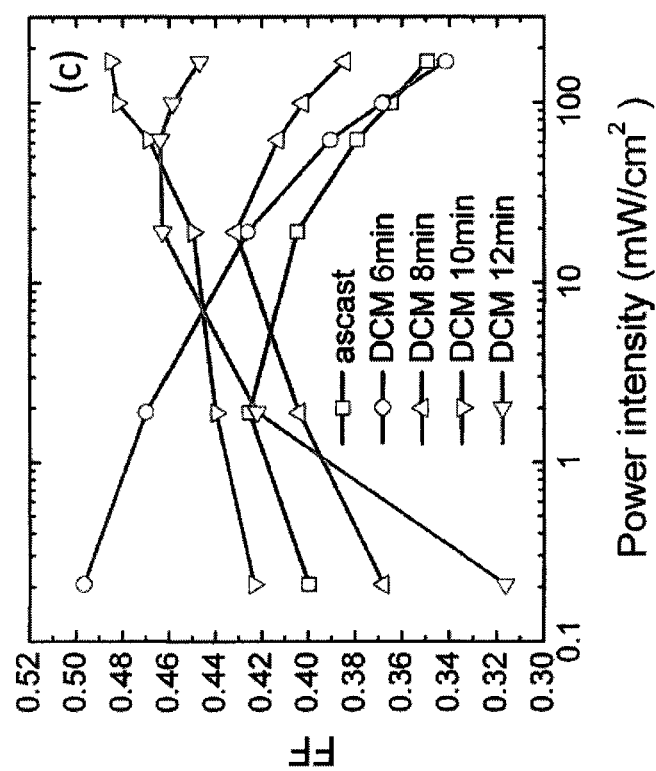
FIG. 2C illustrates FF versus power intensity for SQ:PC$_{70}$BM (1:6) bulk solar cells cast from 1,2-dichlorobenzene and solvent annealed with dichloromethane for various exposure periods.

The fill factor of the SQ:PC$_{70}$BM (1:6) bulk cells as-cast from chloroform solvent was by thermal annealing at temperatures ranging from 50° C. to 130° C. is shown in FIG. 2A. The thermal annealing process did not appear to improve the fill factor, which was consistent with the XRD data of FIG. 1A and suggested that the thermal annealing does yield an appreciable crystallinity evolution. The results for the SQ:PC$_{70}$BM (1:6) devices cast from chloroform solvent after DCM solvent annealing process are shown in FIG. 2B. As shown, there appears to be an improvement of fill factor with DCM annealing time of 6 min at 1 sun illumination. In the SQ:PC$_{70}$BM (1:6) devices (FIG. 2C) cast from DCB solvent, the fill factor appears to fall off quickly. In contrast, the fill factor of the DCM annealed devices with duration of 10 min appears to increases gradually at 1 sun illumination. As shown in FIG. 1A, it appears that the longer duration of DCM solvent annealing time increases the crystallinity of SQ phase in the blends, and the elongated DCM annealing time in the SQ:PC$_{70}$BM (1:6) blends does improve the fill factor, which is believed to be due at least in part to the increased aggregated/crystalline content of SQ phase.

External quantum efficiencies (EQE) of the as-cast and solvent annealed SQ:PC$_{70}$BM (1:6) bulk cells cast from DCB solvent in FIG. 3A suggest broad and good spectral responses from 300 nm to 750 nm. The EQE peak at about $\lambda=690$ nm is believed to be due to SQ absorption, where the peaks centered at about $\lambda=350$ nm and 500 nm, appear to result from PC$_{70}$BM absorption. With the DCM solvent annealing time of 10 min, the resulting EQE peak increases and curve shift suggest a more balanced exciton dissociation and charge collection after post DCM solvent annealing process.

Figure 3C:
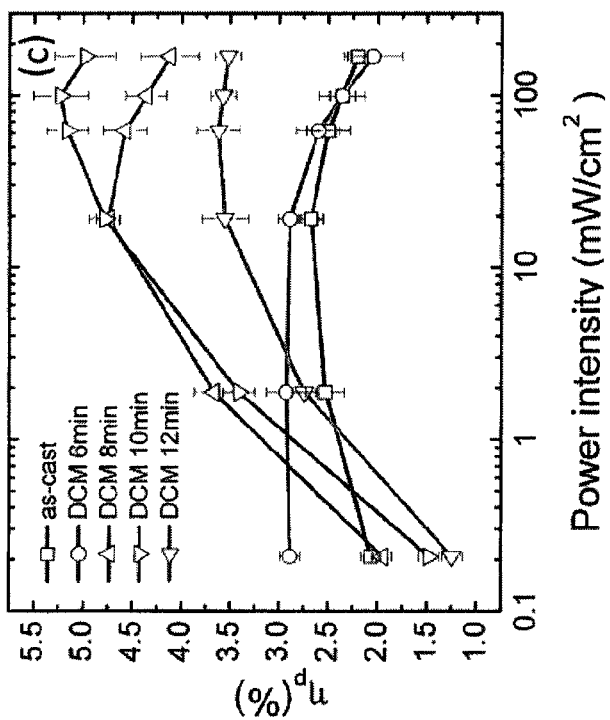
FIG. 3C illustrates $\eta_P$ versus power intensity for bulk heterojunction devices cast from 1,2-dichlorobenzene and solvent annealed with dichloromethane for various exposure periods.

The J-V characteristics of the SQ:PC$_{70}$BM (1:6) bulk cells cast from DCB solvent are shown in FIG. 3B illuminated at 1 sun. Subsequent DCM solvent annealing appears to increase the short circuit current density, and change the shape of the J-V curves, suggesting the devices become more conductive. The FF of the SQ:PC$_{70}$BM (1:6) bulk devices with 10 min DCM annealing appear to have relatively higher values at higher power intensities compared with as-cast devices, suggesting better carrier charge transport interior of bulk films. FIG. 3C shows that the DCM solvent annealed devices also exhibit an obvious enhancement in $\eta_P$ versus power intensity. These results appears to be consistent with the behavior of the thermal and solvent annealed devices shown in FIGS. 2A and 2B.

Example 2

X-ray-diffraction (XRD) patterns of the SQ:PC$_{70}$BM (in relative weight concentrations of 1:6) thin films spin-coated 1000 rpm for 30 sec on indium tin oxide (ITO)-coated glass substrates precoated with 80 Å MoO$_3$ at a low rate of 1000 RPM (revolutions per minute) were obtained using a Rigaku diffractometer in the θ-2θ geometry using a 40 kV Cu K$_\alpha$ radiation source. The thicknesses of the SQ:PC$_{70}$BM (1:6) blend cast from 42 mg/ml solutions in 1,2 dichlorobenzene (DCB) heated on a hotplate for 12 h, as determined by using Woolam VASE ellipsometer, were 780 Å.

Atomic force microscopy (AFM) images were collected in a Nanoscope III AFM in the tapping mode. Solvent annealing of SQ:PC$_{70}$BM (1:6) deposited films was done in a closed glass vial filled with 1 ml dichloromethane (DCM) for a time varying from 6 min to 30 min. For transmission electron microscopy (TEM) studies, the SQ:PC$_{70}$BM (1:6) films on ITO substrate coated with 80 Å MoO$_3$ were immersed in deionized (DI) water for 1 hour. Next, the MoO$_3$ was dissolved in water, and the organic layers were floated on the surface of the DI water. Then the as-cast and solvent annealed SQ:PC$_{70}$BM (1:6) films were transferred onto holy carbon film coated Cu grids. The TEM images were taken using a 200 kV JEOL 2010F analytical electron microscope.

The absorption spectra of the as-cast and four DCM annealed films on quartz substrates were measured using a Perkin-Elmer Lambda 1500 UV-NIR spectrometer. Photoluminescence (PL) was measured with an excitation wavelength of $\lambda=600$ nm. Solar cell structures employed the following structure: ITO/MoO$_3$ (80 Å)/SQ:PC$_{70}$BM (1:6 780 Å)/C$_{60}$ (40 Å)/BCP (10 Å)/Al (1000 Å). Here, MoO$_3$ is thermally evaporated onto the ITO surface in a vacuum system with a base pressure of $10^{-7}$ torr. Following spin cast deposition at and solvent annealing, devices were completed by thermally evaporating a 8 Å LiF and 1000 Å thick Al cathode through a shadow mask resulting in a device area of $8 \times 10^{-3}$ cm$^2$. The current density-voltage (J-V) characteristics and power conversion efficiency ($\eta_P$) of the devices were measured using an Oriel 150 W solar simulator irradiation from a Xe arc lamp with AM1.5G filters and an NREL-calibrated standard Si detector. Measurements and solar spectral correction were made using standard methods. The EQE was measured using monochromatic light from a Xe-lamp was chopped at 200 Hz and focused to the device active area.

Figure 4:
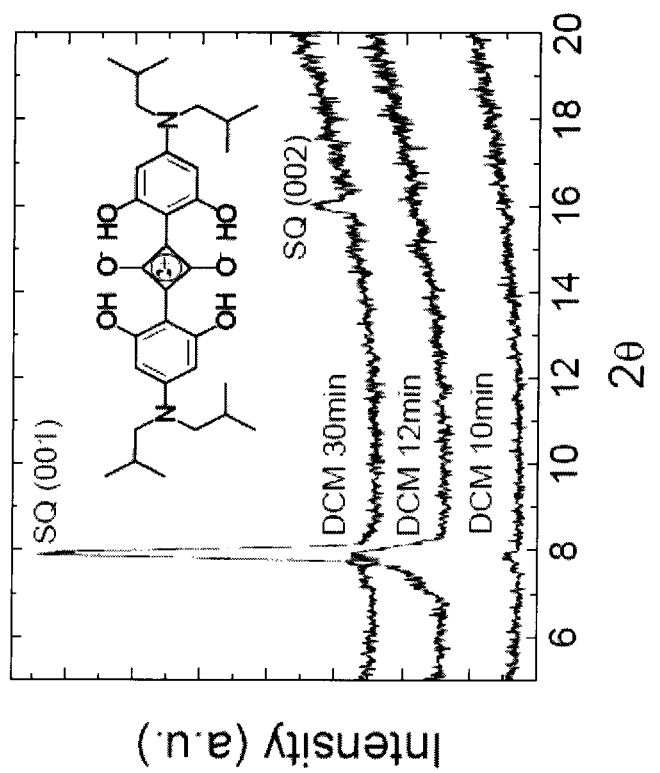
FIG. 4 illustrates the XRD for SQ:PC$_{70}$BM (1:6) bulk solar cells cast from DCB and solvent annealed with dichloromethane for various exposure periods.

Post annealing of SQ:PC$_{70}$BM (1:6) blends entailed the 6 min to 30 min exposure of the films to DCM vapors in a closed glass vial enclosed in an ultrahigh purity nitrogen filled glove box at room temperature. As shown in FIG. 4, the lack of X-ray diffraction (XRD) peak for as-deposited SQ:PC$_{70}$BM films suggests an amorphous structure. In contrast, after annealing for 10 min, a peak appears at about $2\theta=7.80\pm0.08°$ that increases in intensity when the annealing time is extended to 30 min. This peak is the (001) reflection of SQ, corresponding to an intermolecular spacing of about $11.26\pm0.16$ Å. After a 30 min exposure to DCM, a second peak corresponding to the (002) reflection appears, suggesting a continued increase in order. The mean crystal sizes of SQ in the blends annealed for 12 min and 30 min are estimated to be $2.0\pm0.2$ nm and $51\pm4$ nm, respectively, inferred from the XRD peak broadening using the Scherrer method.

Figure 5A:
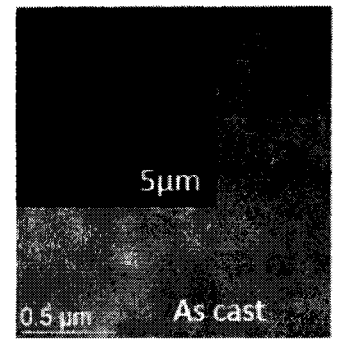
FIG. 5A-5C illustrates the RMS of bulk heterojunction devices as-cast from DCB, solvent annealed with dichloromethane for 12 minutes, and solvent annealed with dichloromethane for 30 minutes, respectively.
Figure 5A:
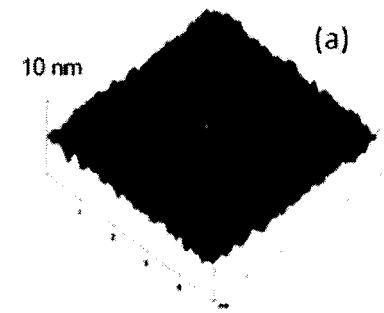
Figure 5B:
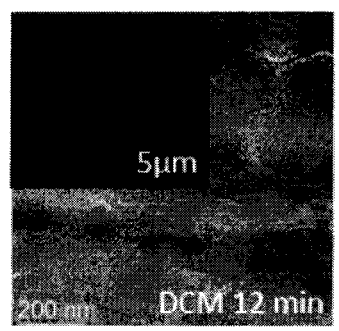
Figure 5B:
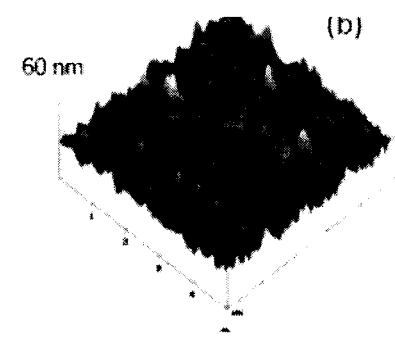
Figure 5C:
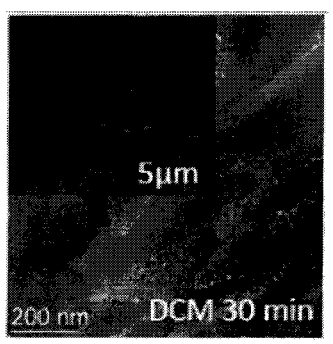
Figure 5C:
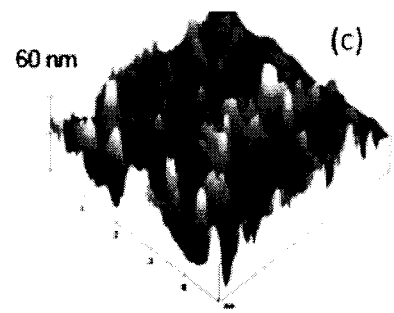

The root-mean-square roughness obtained from the AFM images (FIG. 5A) of the as-cast film is about $0.8\pm0.1$ nm. In contrast, the roughness of the blend after 12 min solvent annealing increases to about $8.4\pm1.2$ nm (FIG. 5B), suggesting substantial roughening due to the polycrystalline growth of SQ in the mixture. With even longer annealing of 30 min, the phase separation of SQ and PC$_{70}$BM continues, as suggested by further roughening to $12.0\pm1.4$ nm (FIG. 5C). The roughening, which is believed to be due in part to phase separation, has also been observed in transmission electron microscope (TEM) image (FIG. 5C) and surface phase image measured by AFM (the inset in FIG. 5C). The average crystal domain size also appears to increase concomitant with the roughening, as noted above from the XRD line broadening.

The spectra in the visible for the as-cast, and four DCM solvent-annealed SQ:PC$_{70}$BM blended films on quartz substrates are shown in FIG. 6A. The absorption coefficient of SQ throughout the entire observed spectral range increases with annealing time of up to 8 min, but as time is further increased, the change appears to become saturated. It also appears that the crystalline blend film (DCM 12 min) has a less pronounced absorption peak at $\lambda=680$ nm than in the amorphous films.

The photoluminescence (PL) intensity of a film is quenched in the presence of charge transfer from photo-generated donor excitons to acceptor molecules (FIG. 6B). Therefore, efficient PL quenching in the SQ:PC$_{70}$BM blends suggests efficient exciton dissociation due to photogeneration within a distance, L$_D$, of an interface. As above, the relevant length scales are 1.6 nm for SQ, and 20 nm to 40 nm for PC$_{70}$BM. A 10 min appears to yield a maximum PL intensity quenching, followed by a reduction in quenching as the annealing time is further increased. Without being bound to any particular theory, this may be understood in terms of our values of L$_D$ and mean crystallite size, δ. The PL quenching appears strongest when L$_D$~δ~2 nm after approximately 10-12 min annealing. Additional annealing appears to lead to initiation of further phase segregation as the crystals, at which point δ>>L$_D$, and hence the excitons are no longer efficiently transported to a dissociating heterointerface.

The EQE of the as-cast and solvent annealed solar cells in FIG. 6C suggest a similarly broad spectral response as the absorption spectrum, extending from a wavelength of λ=300 nm to λ=750 nm. The EQE peak of SQ increases from about 26±2% (as-cast) to about 60±1% (annealed for 10 min). After a 12 min anneal, the peak EQE is reduced to <40% across the entire wavelength range. These results, analogous to those obtained in absorption, further suggest that the cell efficiency depends strongly on crystallite size, with the optimum size comparable to L$_D$, thereby leading to maximum exciton diffusion to the dissociating donor/acceptor interface between SQ and PC$_{70}$BM.

The J-V characteristics in FIG. 6D measured under 1 sun, AM1.5G simulated solar emission, suggest that the short circuit current density (J$_{sc}$) is enhanced from about 6.9 mA/cm$^2$ (as-cast) to about 12.0 mA/cm$^2$ (10 min solvent anneal), and then decreases to about 8.3 mA/cm$^2$ after 12 min exposure to DCM. The FF results exhibit a similar dependence on annealing time, suggesting that the extended order decreases the series resistance, as anticipated for crystalline organic materials with improved molecular packing. Fitting the forward J-V curves using the modified diode equation yields the specific series resistance, R$_{SA}$. The as-cast cell has R$_{SA}$ of about 35.2±1.0 Ω·cm$^2$, then gradually reduces to about 5.0±0.5 Ω·cm$^2$ when the annealing time is 12 min. However, it is believed that a further increase of DCM annealing time may increase the density of pinholes between active layer and the contacts, leading to shorted diodes.

Figure 7B:
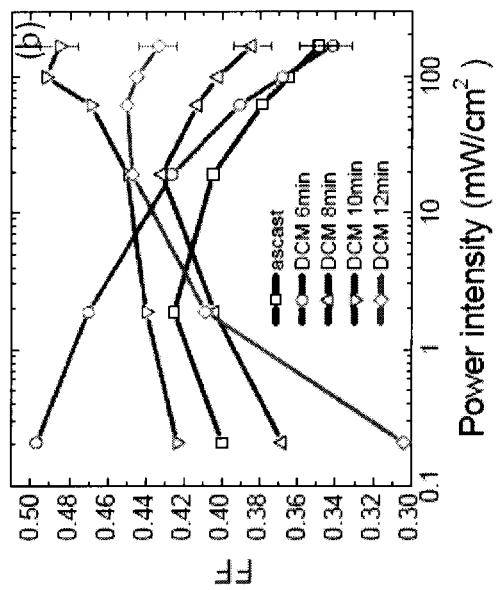
FIG. 7B illustrates FF versus power intensity for SQ:PC$_{70}$BM (1:6) bulk solar cells cast from DCB and solvent annealed with dichloromethane for various exposure periods.
Figure 7A:
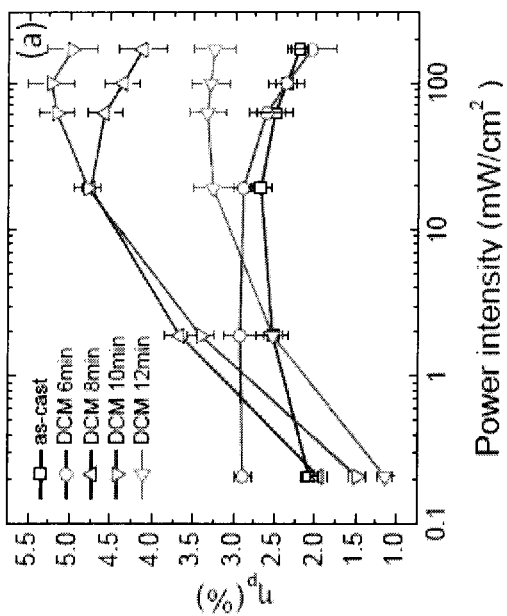
FIG. 7A illustrates $\eta_P$ versus power intensity for SQ:PC$_{70}$BM (1:6) bulk solar cells cast from DCB and solvent annealed with dichloromethane for various exposure periods.

The optical and electrical changes on annealing appear to lead to an increase in η$_p$, as shown in FIG. 7A. Here, the as-cast cell η$_p$ appears to increase slightly with power intensity, then appears to tail off to about 2.4±0.1% at 1 sun, along with a concomitant decrease in FF from about 0.40±0.02 (at 0.002 sun) to about 0.36±0.01 (1 sun) (see FIG. 7B). In contrast, for the 10 min annealed cell the FF increases from about 0.42±0.01 (0.002 sun) to about 0.50±0.01 (1 sun), while η$_p$ appears to correspondingly increase from 1.5±0.1% to 5.2±0.3% (1 sun), with a peak measured value for a cell in this population of 5.5% (J$_{SC}$=12.0 mA/cm$^2$, FF=0.5 and V$_{OC}$=0.92 V). Finally, the 12 min annealed cell shows a roll off in η$_p$ of about 3.2±0.1%, which may be attributed to the reduced EQE and FF.

Example 3

Figure 8A:
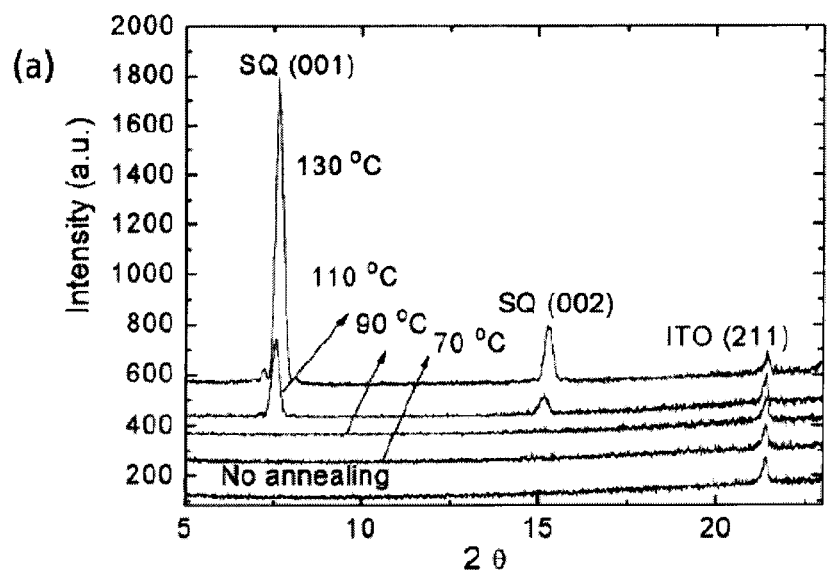
FIG. 8A illustrates the XRD (x-ray diffraction) data for several SQ:C$_{60}$ planar cells thermally annealed at various temperatures for a period of 20 minutes.
Figure 8B:
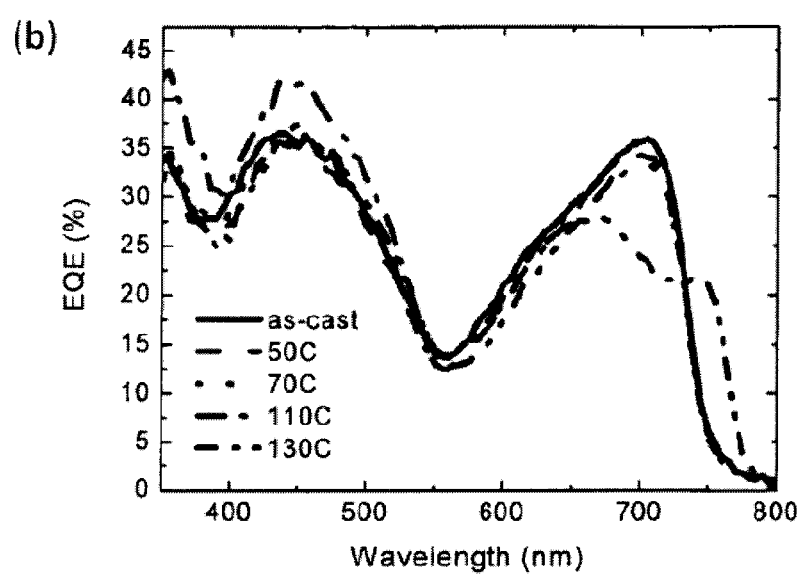
FIG. 8B illustrates EQE for the planar SQ:C60 devices tested in FIG. 8A.
Figure 9A:
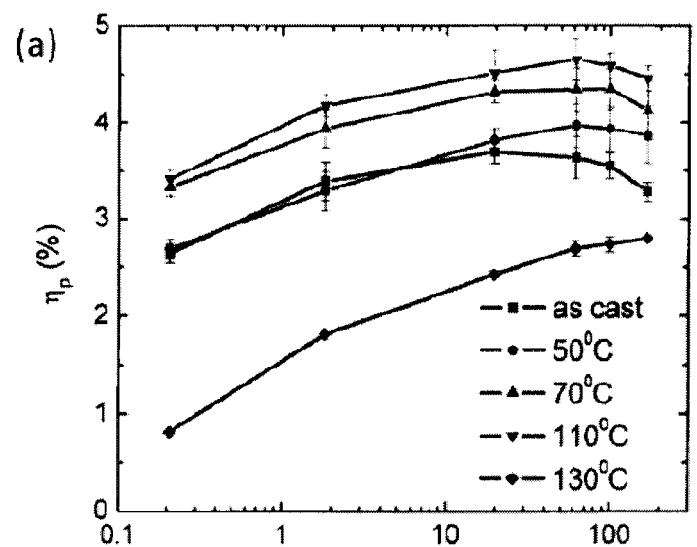
FIG. 9A illustrates $\eta_P$ versus power intensity for the planar SQ:C60 devices tested in FIG. 8A.
Figure 9B:
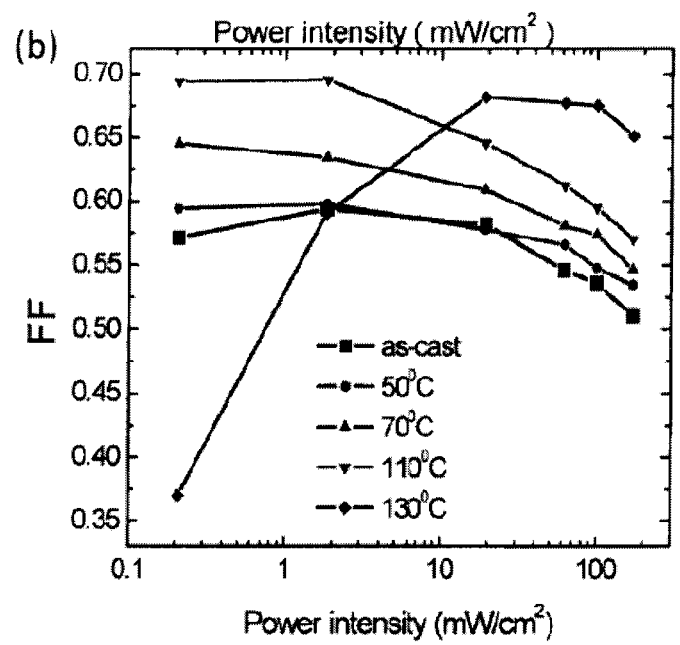
FIG. 9B illustrates FF versus power intensity for the planar SQ:C60 devices tested in FIG. 8A.

SQ/C$_{60}$ planar cells were fabricated as control cells to compare the bilayer structure with bulk solar cells. The as-cast SQ thin layers are annealed from 50° C. to 130° C. to investigate the effect of crystallinity to device performance. As shown in FIG. 8A, the SQ films annealed at 110° C. and 130° C. shows (001) and (002) peaks, suggesting crystal features. The EQE of the planar cells (FIG. 8B) suggest an improvement of photoresponse with annealing temperature increased to 110° C. At annealing temperature of 130° C., there are two peaks of about 650 nm and about 760 nm which belong to SQ films, suggesting that monomer SQ has experienced a dimerization process with increased annealed temperature. The cells annealed at 110° C. peaks efficiency (η$_p$) of about 4.6% with FF=0.59, V$_{OC}$=0.76 V and J$_{SC}$=10.05 mA/cm$^2$ at 1 sun illumination and FF goes up close to about 0.70 at lower intensities. With annealing temperature increased to about 130° C., η$_p$ appears to drop off to 2.9% because V$_{OC}$ drops off to 0.46 V (see FIGS. 9A-B). It is believed that increased crystallinity with annealing temperature at 130° C. as shown in FIG. 8A, the FF goes up to 0.67 at higher power intensities.

Figure 10A:
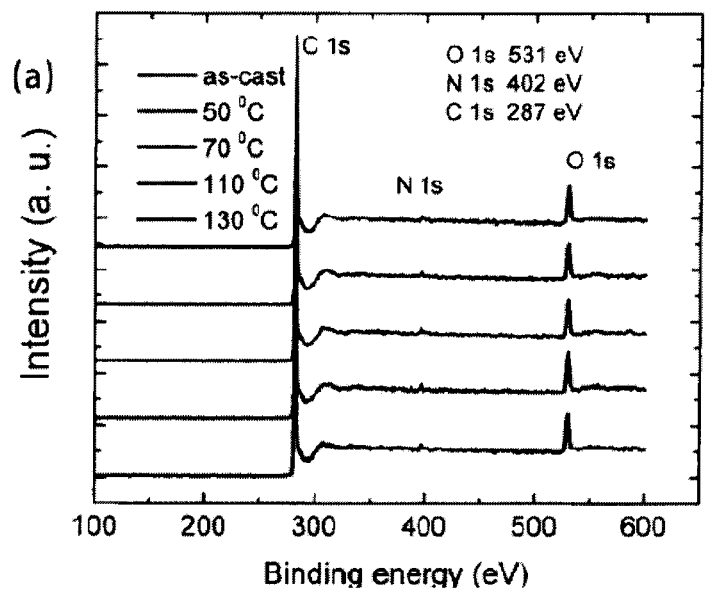
FIG. 10A illustrates the XPS (x-ray photoelectron spectroscopy) measurements for several SQ:PC$_{70}$BM (1:6) bulk heterojunction devices cast from DCB and thermally annealed at various temperatures for a period of 10 minutes.
Figure 10B:
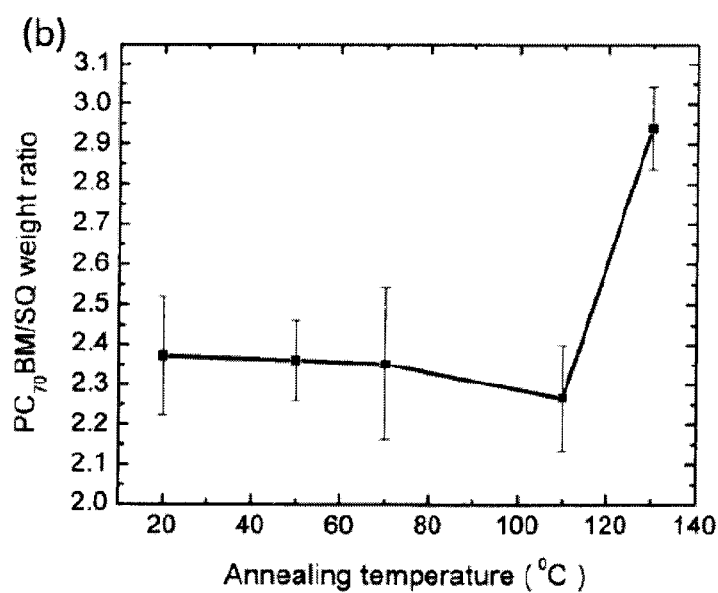
FIG. 10B illustrates AFM (atomic force microscopy) measurements the SQ:PC$_{70}$BM (1:6) bulk heterojunction devices described in FIG. 10A.

SQ:PC$_{70}$BM (1:6) bulk heterojunctions were prepared in a manner similar to the one described in Example 2. There is no XRD peaks for SQ:PC$_{70}$BM (1:6) bulk solar cells annealed at 50° C., 70° C., 110° C. and 130° C. for 10 min, indicating amorphous feature. Without being bound to any particular theory, it is believed that PC$_{70}$BM disrupts the aggregation of SQ molecules and damages its crystallinity. The roughness of AFM images for the as-cast and four thermally annealed samples are averaged to be about 0.579±0.06 nm and there is no obvious phase separation contrast of SQ and PC$_{70}$BM phases, which is consistent with the measurement of XRD results. The component reorganization of SQ and PC$_{70}$BM through thermal annealing is also investigated by XPS (FIG. 10). The N 1s peak with binding energy of 402 eV suggests the existence of SQ (C$_{32}$H$_{44}$N$_2$O$_6$) aggregation on the top surface of SQ:PC$_{70}$BM films since there is no N atom in the PC$_{70}$BM molecules (C$_{82}$H$_{14}$O$_2$). There are strong peaks of C 1s and O 1s which appear to belong to SQ and PC$_{70}$BM. The composition of SQ and PC$_{70}$BM on the surface for the five samples is evaluated using O/C atomic ratios obtained from the XPS measurement (FIG. 10A). The N peak is too weak, so C/N or O/N atomic ratio is not applied to determine the composition. As shown in FIG. 10B, the concentrations obtained from various SQ:PC$_{70}$BM sample surface are consistent with AFM measurements and there are no obvious weight ratio change after thermal annealing. Thus, from XRD, AFM and XPS measurements, there do not appear to be morphology or crystallinity changes in spin-cast samples through thermal processing only.

Figure 11A:
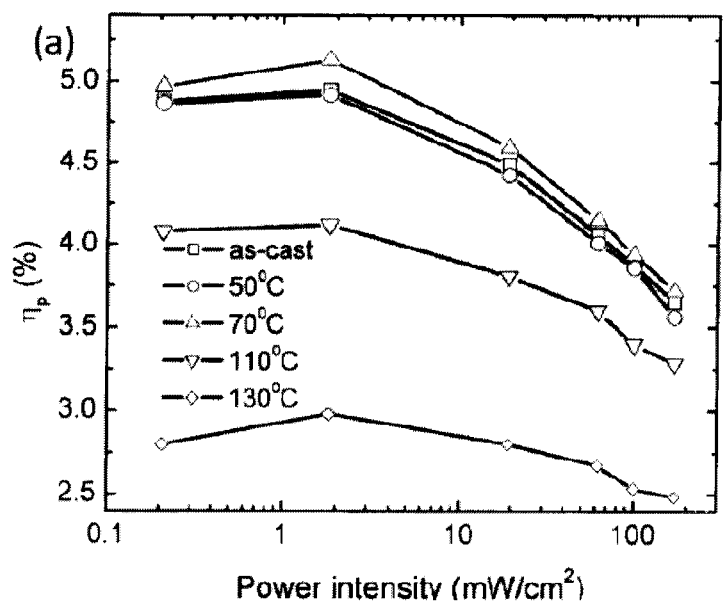
FIG. 11A illustrates $\eta_P$ versus power intensity for the SQ:PC$_{70}$BM (1:6) bulk heterojunction devices tested in FIG. 10A.
Figure 11B:
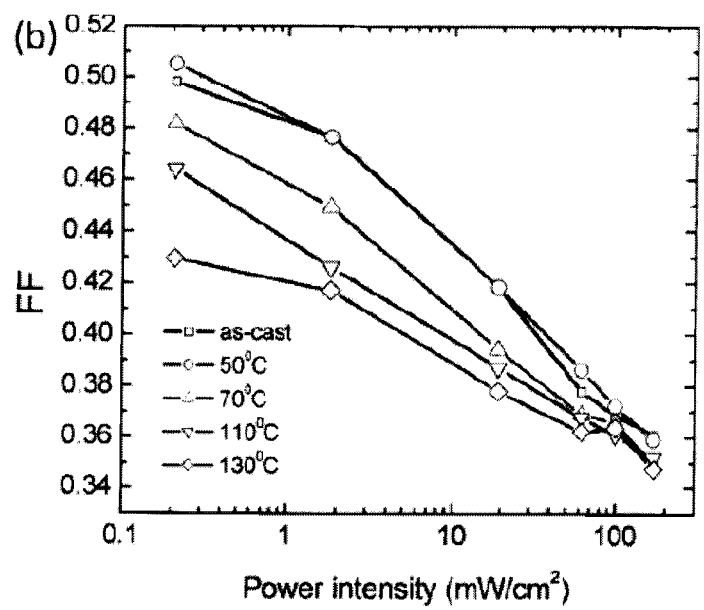
FIG. 11B illustrates FF versus power intensity for the SQ:PC$_{70}$BM (1:6) bulk heterojunction devices tested in FIG. 10A.

The device performance for the five devices is shown in FIG. 11. The efficiency of the SQ:PC$_{70}$BM (1:6) bulk cells annealed at 70° C. drops from about 5.3 with FF=0.48 at 0.02 sun (2 mW/cm$^2$) AM 1.5 G illumination, to about 4.0% with FF=0.37 at 1 sun. The roll-off of FF suggests these bulk solar cells remain resistive and exhibit a lack of bi-continuous charge transport pathways to respective electrodes which, in turn, may inhibit the extraction of free carriers.

Figures 12A, 12B, 12C, 12D:
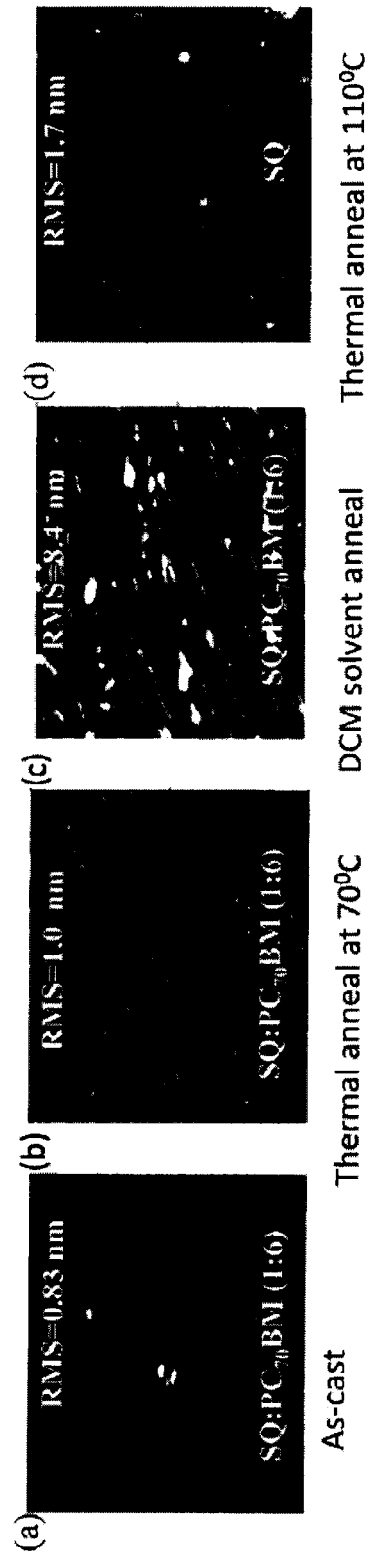
FIG. 12A illustrates the RMS (roughness measurement system) of an SQ:PC$_{70}$BM (1:6) bulk heterojunction device as-cast from DCB.
FIG. 12B illustrates the RMS roughness of an SQ:PC$_{70}$BM (1:6) bulk heterojunction device cast from DCB, followed by thermal annealing at 70° C.
FIG. 12C illustrates the RMS roughness of an SQ:PC$_{70}$BM (1:6) bulk heterojunction cast from DCB, followed by solvent vapor annealing with dichloromethane for 30 minutes and thermal annealing at 50° C.
FIG. 12D illustrates the RMS roughness of an SQ:PC$_{70}$BM (1:6) bulk heterojunction device cast from DCB, followed by thermal annealing at 110° C.
Figure 12E:
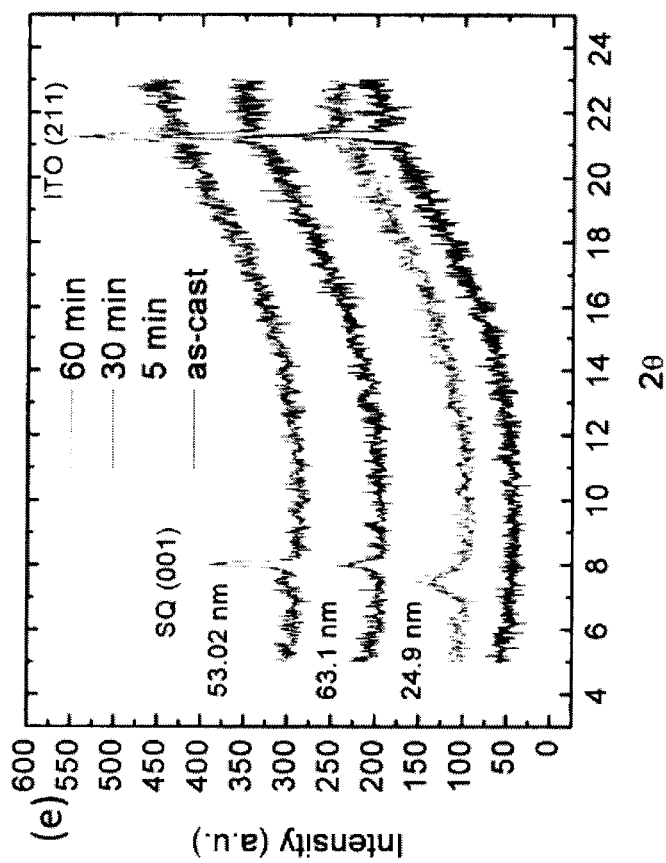
FIG. 12E illustrates XRD data for SQ:PC$_{70}$BM (1:6) bulk heterojunction devices cast from DCB, followed by solvent vapor annealing with dichloromethane for various time periods, and thermally annealed at 50° C.

To further control the morphology change and crystallinity of SQ and PC$_{70}$BM in the as-cast films, combinations solvent and thermal annealing were explored. Solvent annealing time is controlled by keeping films inside a covered glass jar immediately after spin-coating in air. The jar is filled with 1 ml Dichloromethane (DCM). The jar is covered with a lid in order to prevent rapid evaporation of the solvent. Then as-cast and four annealed films were put on a hotplate in N$_2$ glovebox to anneal at 50° C. to remove remaining DCM solvent. As shown in FIG. 12, the roughness of SQ:PC$_{70}$BM films increases with one order of magnitude from about 0.83 nm (FIG. 12A—as-cast without solvent or thermal annealing) to about 8.4 nm (FIG. 12C—DCM for solvent annealing for 30 min, followed by thermal annealing at 50° C.). The results for FIGS. 12B and 12D exhibit results for thermal annealing only. XRD data (FIG. 12E—films exposed to various solvent annealing times, followed by thermal annealing at 50° C.) clearly shows that there is a (001) SQ peak for SQ:$PC_{70}BM$ films annealed at longer time, suggesting DCM vapor phase does promote nanoscale phase separation of SQ:$PC_{70}BM$ mixture by the solubility and volatility of DCM annealing solvent. The results suggest that the morphology and molecular ordering of SQ:$PC_{70}BM$ bulk solar cells may be controlled by the solubility and vapor pressure of annealing solvent.

Figure 13A:
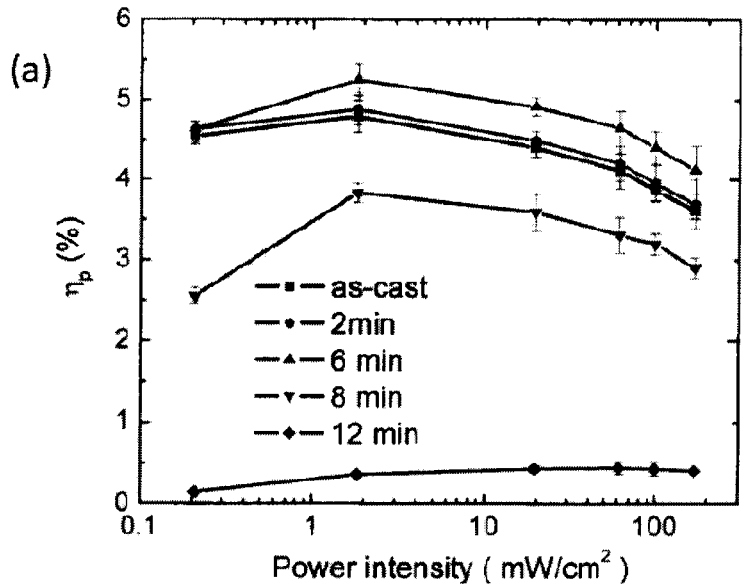
FIG. 13A illustrates $\eta_P$ versus power intensity for the SQ:PC$_{70}$BM (1:6) bulk heterojunction devices cast from DCB, followed by solvent vapor annealing with dichloromethane for various time periods and thermal annealing at 50° C.
Figure 13B:
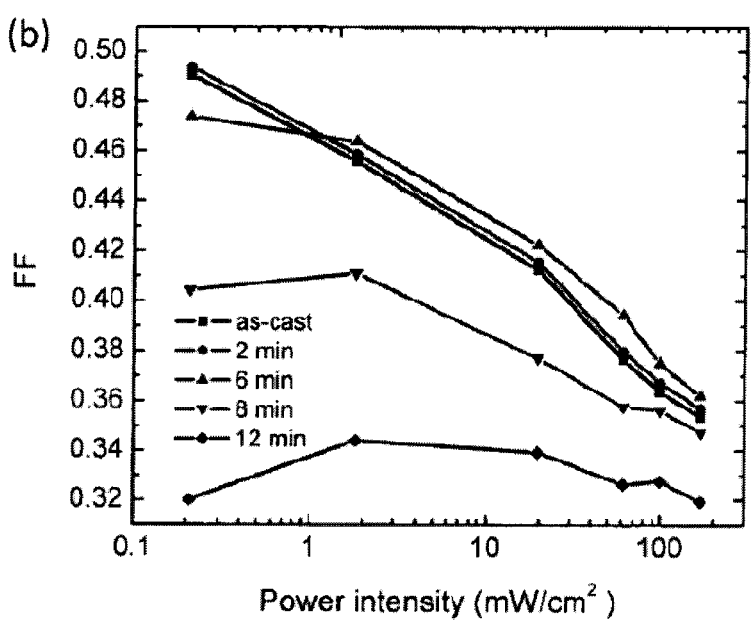
FIG. 13B illustrates FF versus power intensity for the SQ:PC$_{70}$BM (1:6) bulk heterojunction devices tested in FIG. 13A.
Figure 14:
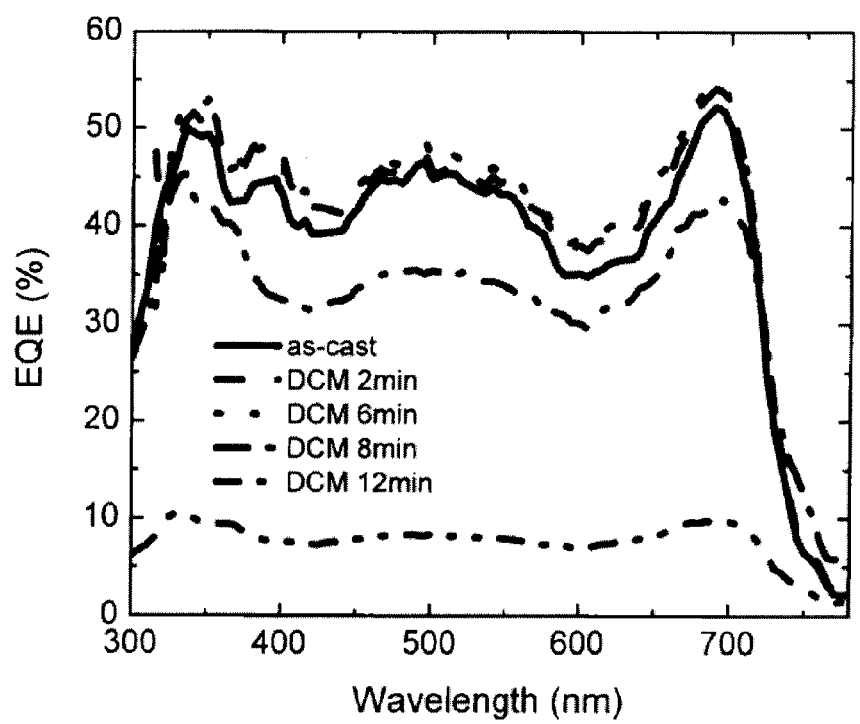
FIG. 14 illustrates EQE for the SQ:PC$_{70}$BM (1:6) bulk heterojunction devices tested in FIG. 13A.
Figure 15:
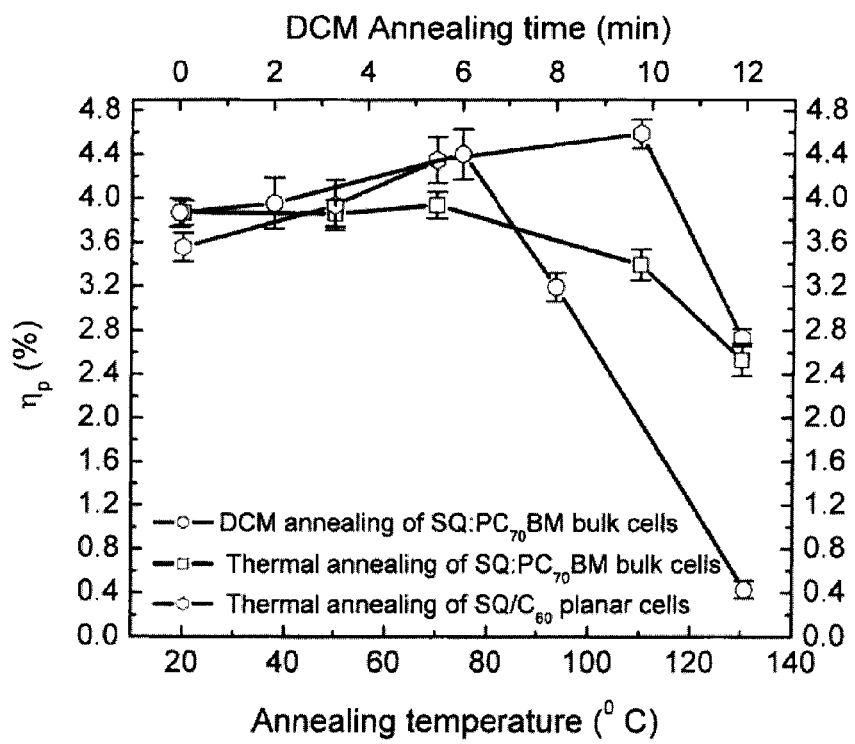
FIG. 15 illustrates $\eta_P$ summary of SQ/C$_{60}$ planar cells as-cast and thermally annealed at various temperatures, SQ:PC$_{70}$BM (1:6) bulk cells as-cast and thermally annealed at various temperatures, and SQ:PC$_{70}$BM (1:6) bulk cells as-cast and DCM solvent annealed for 2 min, 6 min, 8 min and 12 min at 1 sun illumination.

The performance of the devices exposed to solvent annealing with DCM for various periods, and then thermally annealed at 50° C., are set forth in FIG. 13. The highest efficiency of about 5.3% is achieved for samples annealed for 6 min with FF=0.47 at 0.02 sun AM 1.5 G illumination, then it slowly drops to about 4.4% with FF=0.39 at 1 sun. The FF of the SQ:$PC_{70}BM$ bulk devices with 6 min DCM annealing appears to have higher values at higher power intensities compared with as-cast devices, suggesting better carrier charge transport interior of bulk films. The crystallinity feature of SQ in the mixture suggests SQ molecules aggregate in order which can enhance the hole charge transport. At some extent, the DCM solvent annealing appears to reduce the charge imbalance which deteriorates the device performance from thermal annealing only. Since FF is still lower than 0.50 for DCM annealed devices, well-controlled phase separation of SQ and $PC_{70}BM$ mixture in nanoscale may be explored further through various solvent and annealing time. FIG. 14 shows the EQE response of as-prepared devices described in FIG. 13, which exhibit spectral response from about 300 nm to about 750 nm.

Other than in the examples, or where otherwise indicated, all numbers expressing quantities of ingredients, reaction conditions, analytical measurements, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present disclosure. At the very least, and not as an attempt to limit the application of the doctrine of equivalents to the scope of the claims, each numerical parameter should be construed in light of the number of significant digits and ordinary rounding approaches.

Notwithstanding that the numerical ranges and parameters setting forth the broad scope of the disclosure are approximations, unless otherwise indicated the numerical values set forth in the specific examples are reported as precisely as possible. Any numerical value, however, inherently contains certain errors necessarily resulting from the standard deviation found in their respective testing measurements.

As used herein the terms "the," "a," or "an" mean "at least one," and should not be limited to "only one" unless explicitly indicated to the contrary. Thus, for example, "a layer" should be construed to mean "at least one layer."

What is claimed is:

1. A method of preparing a photosensitive device, comprising:
   providing a structure having at least one first electrode and a bulk heterojunction, wherein said bulk heterojunction comprises at least one first organic photoactive material and at least one second organic photoactive material, wherein said first and second organic photoactive materials are small-molecule materials, and at least one of the first and second organic photoactive materials is a squaraine;
   providing at least one solvent;
   vaporizing at least a portion of the solvent; and
   exposing at least a portion of the bulk heterojunction to the vaporized solvent, wherein said exposure to the vaporized solvent increases the crystallinity of at least one of the first and second organic photoactive materials.

2. The method of claim 1, further comprising thermally annealing said structure.

3. The method of claim 2, wherein the thermal annealing takes place after exposing the bulk heterojunction to the vaporized solvent.

4. The method of claim 2, wherein the thermal annealing takes place at a temperature of about 50° C. or greater.

5. The method of claim 1, wherein the structure is prepared by depositing the at least one first and the at least one second small molecule organic photoactive materials over the at least one first electrode.

6. The method of claim 5, wherein the deposition is performed by spin-casting.

7. The method of claim 6, wherein the at least one first and the at least one second small molecule organic photoactive materials are cast from a casting solvent having a boiling point no greater than about 70° C. at 1 atm.

8. The method of claim 7, wherein the casting solvent is chloroform.

9. The method of claim 6, wherein the at least one first and the at least one second small molecule organic photoactive materials are cast from a casting solvent having a boiling point greater than about 175° C. at 1 atm.

10. The method of claim 9, wherein the casting solvent is 1,2-dichlorobenzene.

11. The method of claim 5, further comprising positioning an interfacial layer between the at least one first electrode and the bulk heterojunction.

12. The method of claim 1, further comprising patterning at least one second electrode over the bulk heterojunction.

13. The method of claim 12, further comprising positioning at least one blocking layer between the bulk heterojunction and the at least one second electrode.

14. The method of claim 1, wherein the at least one blocking layer comprises BCP.

15. The method of claim 1, wherein the bulk heterojunction is exposed to the vaporized solvent in a closed container.

16. The method of claim 1, wherein the bulk heterojunction is exposed to the vaporized solvent for a period of about 5 minutes to about 30 minutes.

17. The method of claim 1, wherein the at least one solvent is dichloromethane.

18. The method of claim 1, wherein the squaraine is 2,4-bis[4-(N,N-diisobutylamino)-2,6-dihydroxyphenyl] squaraine.

19. The method of claim 1, wherein one of the first and second organic photoactive materials is $PC_{70}BM$.

20. A method of enhancing the crystallinity of a bulk heterojunction in a photosensitive device, said bulk heterojunction comprising at least one first organic photoactive material and at least one second organic photoactive material, wherein said first and second organic photoactive materials are small-molecule materials, and at least one of the first and second organic photoactive materials is a squaraine, comprising:

exposing at least a portion of the bulk heterojunction to a vaporized solvent, wherein the photosensitive device exhibits one or more of the following characteristics when compared to said device before exposure to the vaporized solvent:

increased fill factor (FF);
increased external quantum efficiency (EQE); and
increased current density versus voltage (J-V).

21. The method of claim 20, further comprising thermally annealing the bulk heterojunction.

22. The method of claim 21, wherein the thermal annealing takes place after exposing the bulk heterojunction to the vaporized solvent.

23. The method of claim 21, wherein the thermal annealing takes place at a temperature of about 50° C. or greater.

24. The method of claim 20, wherein the bulk heterojunction is exposed to the vaporized solvent in a closed container.

25. The method of claim 24, wherein the bulk heterojunction is exposed to the vaporized solvent for a period of about 5 minutes to about 30 minutes.

26. The method of claim 20, wherein the at least one solvent is dichloromethane.

27. The method of claim 20, wherein the squaraine is 2,4-bis[4-(N,N-diisobutylamino)-2,6-dihydroxyphenyl] squaraine.

28. The method of claim 20, wherein one of the first and second organic photoactive materials is $PC_{70}BM$.

* * * * *